United States Patent
Kim et al.

(10) Patent No.: US 9,571,081 B2
(45) Date of Patent: Feb. 14, 2017

(54) STROBE SIGNAL GENERATION CIRCUIT AND SEMICONDUCTOR APPARATUS USING THE SAME

(71) Applicant: SK hynix Inc., Icheon-si, Gyeonggi-do (KR)

(72) Inventors: Jin Hwan Kim, Icheon-si (KR); Young Jun Ku, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 111 days.

(21) Appl. No.: 14/634,314

(22) Filed: Feb. 27, 2015

(65) Prior Publication Data

US 2016/0182029 A1    Jun. 23, 2016

(30) Foreign Application Priority Data

Dec. 22, 2014    (KR) .................. 10-2014-0186109

(51) Int. Cl.
*G11C 7/00* (2006.01)
*H03K 5/15* (2006.01)
*G11C 7/22* (2006.01)

(52) U.S. Cl.
CPC ........... *H03K 5/15006* (2013.01); *G11C 7/222* (2013.01)

(58) Field of Classification Search
CPC ................ H03K 5/15006; G11C 7/222
USPC ............ 365/193, 129, 189.011, 194
See application file for complete search history.

(56) References Cited

U.S. PATENT DOCUMENTS

| 9,007,868 B2 * | 4/2015 | Matsui .................. G11C 7/222 365/193 |
| 2009/0220036 A1 * | 9/2009 | Witters .................... H04L 7/10 375/354 |

FOREIGN PATENT DOCUMENTS

KR    1020080048378 A    6/2008

\* cited by examiner

*Primary Examiner* — Fernando Hidalgo
(74) *Attorney, Agent, or Firm* — William Park & Associates Ltd.

(57) ABSTRACT

A strobe signal generation circuit may include: a counter to generate a first source signal and a second source signal by counting an external strobe signal; a delay to generate a first delayed signal and a second delayed signal by delaying the first source signal and the second source signal by a preset time; and a combination unit to generate internal strobe signals by selectively combining the first source signal, the second source signal, the first delayed signal, and the second delayed signal.

20 Claims, 4 Drawing Sheets

STROBE SIGNAL GENERATION CIRCUIT AND SEMICONDUCTOR APPARATUS USING THE SAME

CROSS-REFERENCES TO RELATED APPLICATION

The present application claims priority under 35 U.S.C. §119(a) to Korean application number 10-2014-0186109, filed on Dec. 22, 2014, in the Korean Intellectual Property Office, which is incorporated herein by reference in its entirety.

BACKGROUND

1. Technical Field

Various embodiments relate to a semiconductor circuit, and more particularly, to a strobe signal generation circuit and a semiconductor apparatus using the same.

2. Related Art

A semiconductor apparatus may receive data and a strobe signal from outside during a write operation, the strobe signal indicating a data input timing.

The semiconductor apparatus, for example, a DDR (Double Data Rate) semiconductor memory may be configured to internally operate in an SDR (Single Data Rate) manner, as the operating speed of the semiconductor memory, that is, the frequency of a clock signal provided from outside increases.

In order for the semiconductor apparatus to operate in the SDR manner, the semiconductor apparatus must internally process the strobe signal provided from outside, and generate an internal strobe signal, that is, a strobe signal divided into even/odd strobe signals.

SUMMARY

In an embodiment of the invention, a strobe signal generation circuit may include a counter to generate a first source signal and a second source signal by counting an external strobe signal. The strobe signal generation circuit may also include a delay to to generate a first delayed signal and a second delayed signal by delaying the first source signal and the second source signal by a preset time. In addition, the strobe signal generation circuit may include a combination unit to generate internal strobe signals by selectively combining the first source signal, the second source signal, the first delayed signal, and the second delayed signal.

In an embodiment of the invention, a semiconductor apparatus may include a memory block to store data or output stored data according to a control signal. The semiconductor apparatus may also include a pad unit including a plurality of pads. Further, the semiconductor apparatus may include a strobe signal generation circuit to generate internal strobe signals by delaying and selectively combining a first source signal and a second source signal generated by counting an external strobe signal inputted through the pad unit. In addition, the semiconductor apparatus may include a control unit to generate the control signal for writing data, inputted through the pad unit from outside in a DDR manner, to the memory block in an SDR manner according to the internal strobe signals during a write operation.

In an embodiment of the invention, a strobe signal generation circuit may include a counter to generate a first source signal by counting a rise edge of a strobe signal and a second source signal by inverting the first source signal.

The strobe signal generation circuit may also include a delay to delay the first source signal and the second source signal by a preset time. Further, the to strobe signal generation circuit may include a combination unit to generate an even strobe signal and an odd strobe signal according to the first source signal, the second source signal, a first delayed signal, and a second delayed signal.

DETAILED DESCRIPTION

Hereinafter, a strobe signal generation circuit and a semiconductor apparatus using the same according to the invention will be described below with reference to the accompanying figures through various embodiments. Various embodiments are directed to a to strobe signal generation circuit of a semiconductor apparatus, which is capable of stably generating a strobe signal regardless of an environment in which an external strobe signal is provided.

With the increase in operating speed of a semiconductor apparatus 100 according to an embodiment of the invention, or, the increase in frequency of a clock signal provided from outside, the semiconductor apparatus 100 may be internally operated in the SDR manner to secure a timing margin for a stable operation.

The semiconductor apparatus 100 according to an embodiment of the invention may be configured to process data in the SDR manner, until the data are outputted to the outside of the semiconductor apparatus 100 after the data are inputted to the semiconductor apparatus 100.

More specifically, outside the semiconductor apparatus 100, a data read/write operation may be performed in the DDR manner. Furthermore, inside the semiconductor apparatus 100, read data and write data may be processed in the SDR manner.

Figure 1:
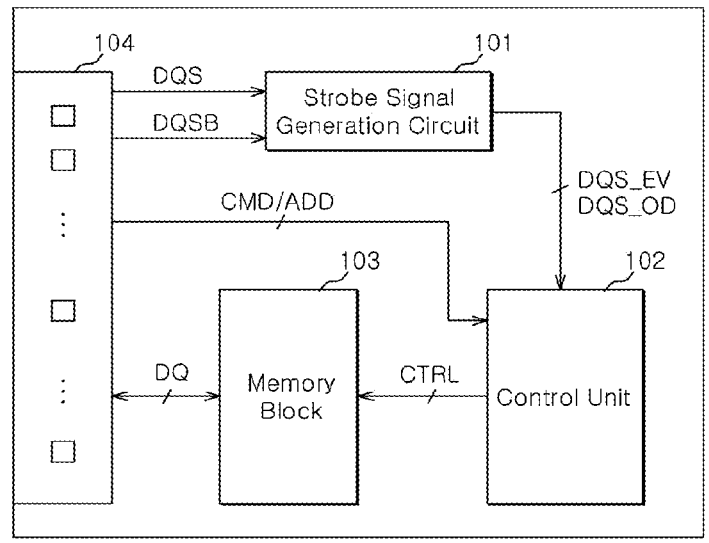
FIG. 1 is a diagram illustrating the configuration of a semiconductor apparatus 100 according to an embodiment of the invention.

Referring to FIG. 1, the semiconductor apparatus 100 according to an embodiment of the invention may include a strobe signal generation circuit 101, a control unit 102, a memory block 103, and a pad unit 104.

The memory block 103 may store data or output stored data in response to a control signal CTRL.

The memory block 103 may include a plurality of unit memory blocks, for example, a plurality of memory banks.

The pad unit 104 may include a plurality of pads, and differential strobe signals DQS/DQSB, a command/address CMD/ADD. Further, data DQ may be inputted through the plurality of pads.

During a write operation, differential strobe signals DQS/DQSB, a command/address CMD/ADD, and data DQ, outputted is from a memory controller such as a CPU or GPU outside the semiconductor apparatus may be provided to the semiconductor apparatus 100 through the pad unit 104.

The differential strobe signals DQS/DQSB may be provided to indicate an input timing of the data DQ provided from outside together with the differential strobe signals DQS/DQSB during the write operation.

The strobe signal generation circuit 101 delay and selectively combine first and second source signals generated by counting an external strobe signal inputted through the pad unit 104 and generate an internal strobe signal.

The external strobe signal may include any one of the differential strobe signals DQS/DQSB.

The internal strobe signal may include an even strobe signal DQS_EV and an odd strobe signal DQS_OD.

The first and second source signals will be described with reference to the following figures.

The control unit 102 may generate a control signal CTRL for writing data DQ, inputted from outside in the DDR manner, to the memory block 103 in the SDR manner according to the even strobe signal DQS_EV and the odd strobe signal DQS_OD during a write operation.

The control unit 102 may generate the control signal CTRL for outputting data stored in the memory block 103 to the outside of the semiconductor apparatus 100 in the DDR manner during a read is operation.

Figure 2:
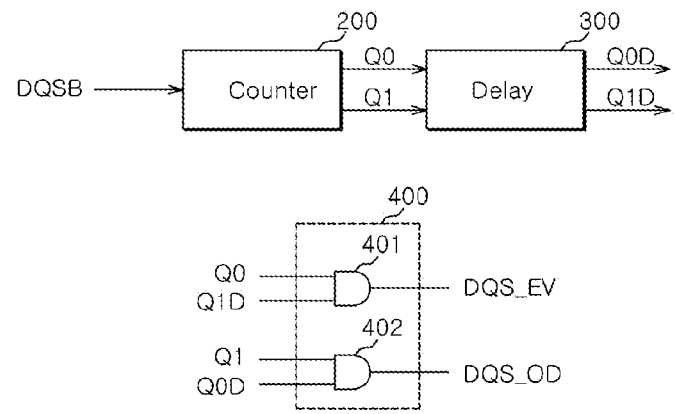
FIG. 2 is a diagram illustrating the configuration of a strobe signal generation circuit 101 of FIG. 1.

Referring to FIG. 2, the strobe signal generation circuit 101 may include a counter 200, a delay 300, and a combination unit 400.

The counter 200 may generate the first and second source signals Q0 and Q1 by counting an external strobe signal, or, one of the differential strobe signals DQS/DQSB, for example, the strobe signal DQSB.

The counter 200 may generate the first source signal Q0 by counting a rising edge of the strobe signal DQSB. Further, the counter 200 may generate the second source signal Q1 by inverting the first source signal Q0.

The delay 300 may generate first and second delayed signals Q0D and Q1D by delaying the first and second source signals Q0 and Q1 by a preset time.

The combination unit 400 may selectively combine the first source signal Q0, the second source signal Q1, the first delayed signal Q0D, and the second delayed signal Q1D, and generate internal strobe signals, or, the even strobe signal DQS_EV and the odd strobe signal DQS_OD.

The combination unit 400 may cross and combine the first source signal Q0 and the second source signal Q1 with the first delayed signal Q0D and the second delayed signal Q1D. Further, the combination unit 400 may generate the internal strobe signals, that is, the even strobe signal DQS_EV and the odd strobe signal DQS_OD.

The combination unit 400 may generate the even strobe signal DQS_EV by combining the first source signal Q0 and the second delayed signal Q1D. In addition, the combination unit 400 may generate the odd strobe signal DQS_OD by combining the second source signal Q1 and the first delayed signal Q0D.

The combination unit 400 may include a first logic gate 401 and a second logic gate 402.

The first logic gate 401 may generate the even strobe signal DQS_EV by performing an AND operation on the first source signal Q0 and the second delayed signal Q1D.

The second logic gate 402 may generate the odd strobe signal DQS_OD by performing an AND operation on the second source signal Q1 and the first delayed signal Q0D.

Figure 3:
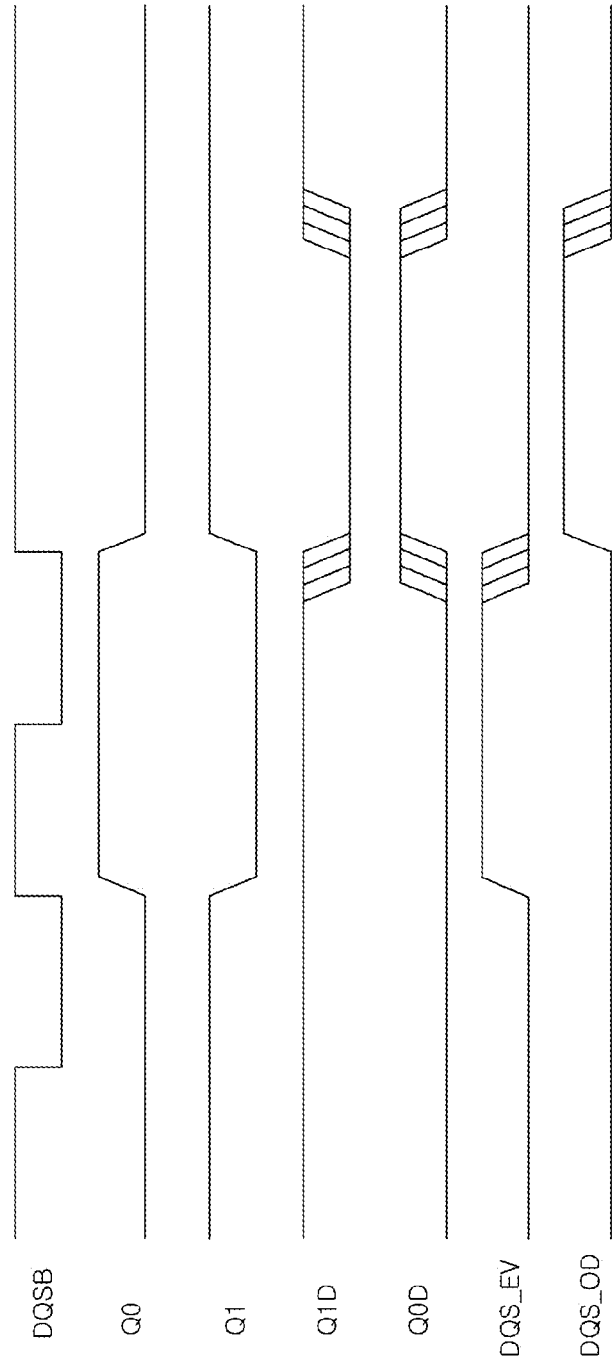
FIG. 3 is an operation waveform diagram of the strobe signal generation circuit 101 of FIG. 2.

Referring to FIG. 3, the operation of the strobe signal generation circuit 101 will be described.

The first source signal Q0 and the second source signal Q1 may be generated according to the strobe signal DQSB of the differential strobe signals DQS/DQSB.

The first source signal Q0 and the second source signal Q1 may be delayed through the delay 300 to generate the first delayed signal Q0D and the second delayed signal Q1D.

The generation timings of rising and falling edges of the first and second delayed signals Q0D and Q1D may differ according to a delay time set in the delay 300.

The result obtained by performing an AND operation on the first source signal Q0 and the second delayed signal Q1D may be generated as the even strobe signal DQS_EV. In addition, the result obtained by performing an AND operation on the second source signal Q1 and the first delayed signal Q0D may be generated as the odd strobe signal DQS_OD.

Figure 4:
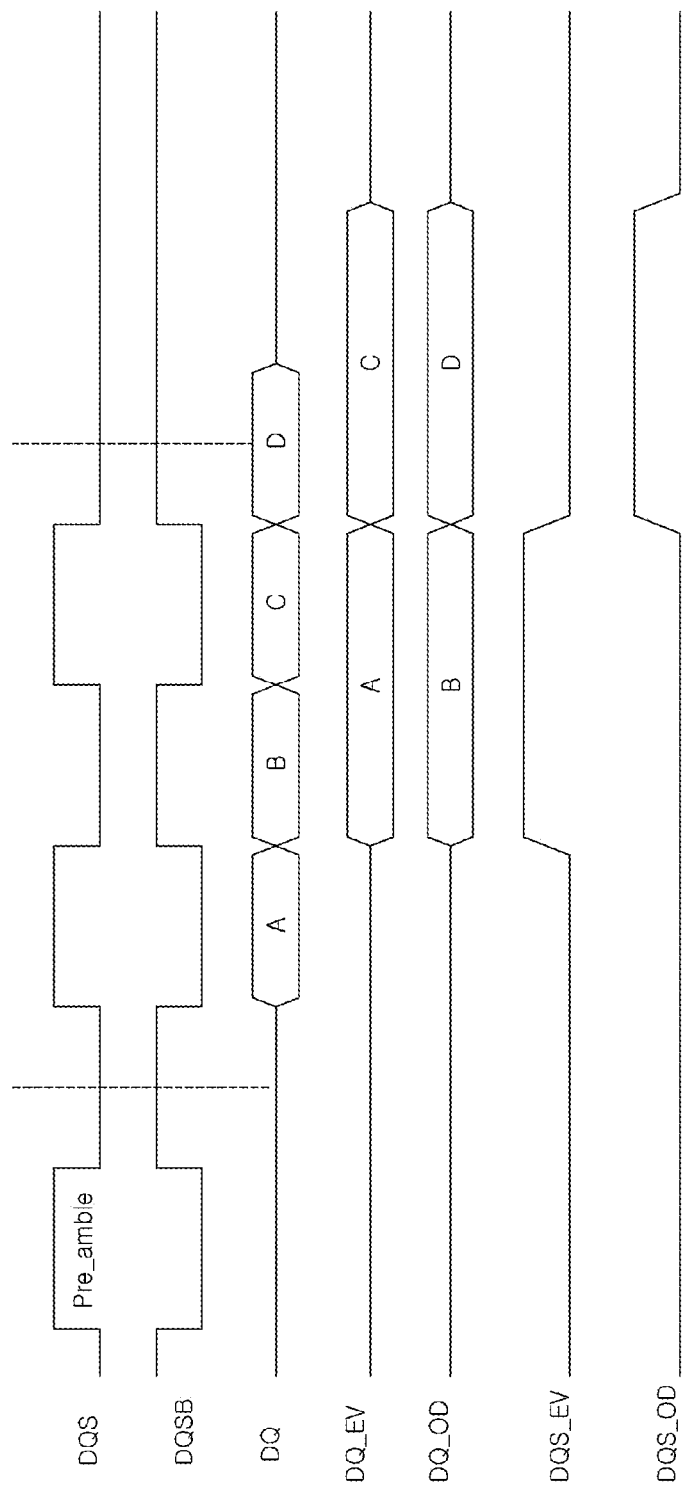
FIG. 4 is a strobe signal waveform diagram during an SDR mode operation of the semiconductor apparatus 100 according to an embodiment of the invention.

Referring to FIG. 4, the SDR mode operation of the semiconductor apparatus 100 according to an embodiment of the invention will be described as follows.

The data DQ and the differential strobe signals DQS/DQSB may be inputted to the semiconductor apparatus 100 through the pad unit 104 from outside.

The data DQ may be inputted to the semiconductor apparatus 100 in the DDR manner at a timing corresponding to the differential strobe signals DQS/DQSB.

The data DQ inputted through the pad unit 104, or, the data A to D may be arranged as even data DQ_EV, that is, the data A and C and odd data DQ_OD, that is, the data B and D, etc.

The pre-ambles or post-ambles of the differential strobe signal DQS/DQSB may be omitted when the data are inputted according to successive write commands.

In FIG. 4, the pre-ambles may be normally inputted, but the post-ambles may be omitted.

When the even strobe signal DQS_EV and the odd strobe signal DQS_OD are generated by dividing any one of the differential strobe signals DQS/DQSB, a falling edge of the odd strobe signal DQS_OD may not be generated.

In an embodiment of the invention, however, the first source signal Q0 and the second source signal Q1 may be generated by counting and inverting a rising edge of the strobe signal DQSB. Further, the first delayed signal Q0D and the second delayed signal Q1D obtained by delaying the first source signal Q0 and the second source signal Q1, may be crossed and combined with the first source signal Q0 and the second source signal Q1. As a result, it is possible to generate the even strobe signal DQS_EV and the odd strobe signal DQS_OD which have a normal waveform regardless of whether the post-ambles exist.

The even data DQ_EV, that is, the data A and C and the odd data DQ_OD, that is, the data B and D may be written to the semiconductor apparatus in the SDR manner according to the even strobe signal DQS_EV and the odd strobe signal DQS_OD.

Figure 5:
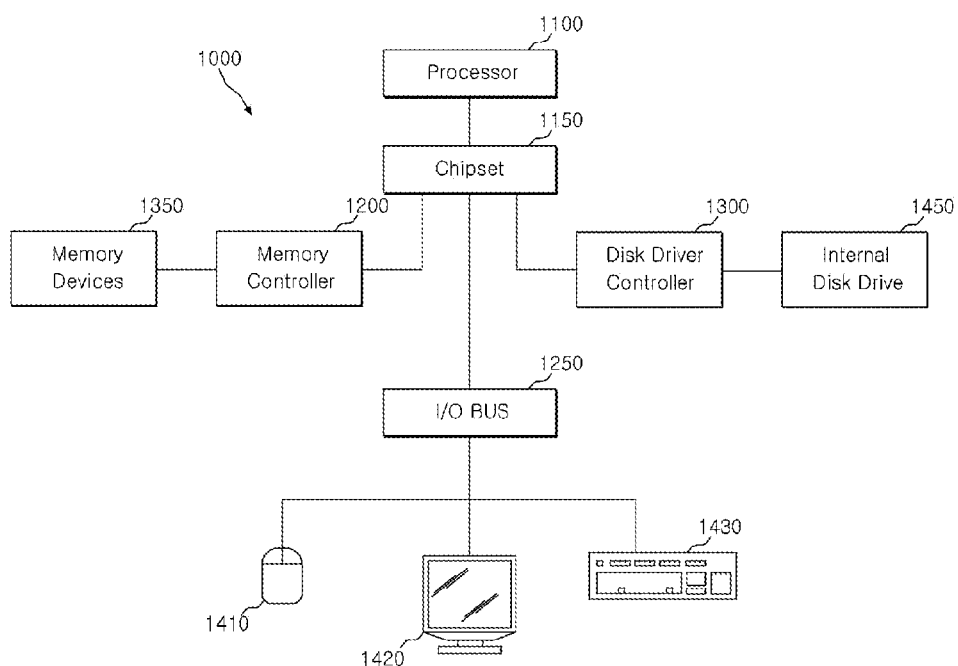
FIG. 5 illustrates a block diagram of a system employing a memory controller circuit in accordance with an embodiment of the invention.

Referring to FIG. 5 a system 1000 may include one or more processors 1100. The processor 1100 may be used individually or in combination with other processors. A chipset 1150 may be electrically coupled to the processor 1100. The chipset 1150 is a communication pathway for signals between the processor 1100 and other components of the system 1000. Other components may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to is the chipset 1150. The memory controller 1200 can receive a request provided from the processor 1100 through the chipset 1150. The memory controller 1200 may be electrically coupled to one or more memory devices 1350. The memory devices 1350 may include the semiconductor apparatus described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420 and 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset 1150 using virtually any type of communication protocol, including all of those mentioned above with regard to the I/O bus 1250.

According to an embodiment of the invention, the strobe signal generation circuit may stably generate the internal strobe signals regardless of the environment in which the external strobe signal is provided, thereby improving the operating performance of the semiconductor apparatus as a result.

While certain embodiments have been described above, it will be understood to those skilled in the art that the embodiments described are by way of example only. Accordingly, the semiconductor apparatus described should not be limited based on the described embodiments. Rather, the semiconductor apparatus described should only be limited in light of the claims that follow when taken in conjunction with the above description and accompanying figures.

What is claimed is:

1. A strobe signal generation circuit comprising:
    a counter to generate a first source signal and a second source signal by counting an external strobe signal;
    a delay to generate a first delayed signal and a second delayed signal by delaying the first source signal and the second source signal by a preset time; and
    a combination unit to generate internal strobe signals by selectively combining the first source signal, the second source signal, the first delayed signal, and the second delayed signal.

2. The strobe signal generation circuit according to claim 1, wherein the external strobe signal is provided to indicate an input is timing of data provided from outside the semiconductor apparatus together with the external strobe signal during a write operation.

3. The strobe signal generation circuit according to claim 1, wherein the external strobe signal comprises differential strobe signals, and the counter generates the first source signal and the second source signal by counting any one of the differential strobe signals.

4. The strobe signal generation circuit according to claim 1, wherein the combination unit generates an even strobe signal as one of the internal strobe signals by combining the first source signal and the second delayed signal, and generates an odd strobe signal as an other of the internal strobe signals by combining the second source signal and the first delayed signal.

5. A semiconductor apparatus comprising:
    a memory block to store data or output stored data according to a control signal;
    a pad unit comprising a plurality of pads;
    to a strobe signal generation circuit to generate internal strobe signals by delaying and selectively combining a first source signal and a second source signal generated by counting an external strobe signal inputted through the pad unit; and
    a control unit to generate the control signal for writing data, inputted through the pad unit from outside in a DDR (Double Data Rate) manner, to the memory block in an SDR (Single Data Rate) manner according to the internal strobe signals during a write operation.

6. The semiconductor apparatus according to claim 5, wherein the external strobe signal is provided to indicate an input timing of data provided from outside the semiconductor apparatus together with the external strobe signal during the write operation.

7. The semiconductor apparatus according to claim 5, wherein the external strobe signal comprises any one of differential strobe signals inputted through the pad unit.

8. The semiconductor apparatus according to claim 5, wherein the internal strobe signals comprise an even strobe signal and an odd strobe signal.

9. The semiconductor apparatus according to claim 5, wherein the strobe signal generation circuit comprises:
    a counter to generate a first source signal and a second source signal by counting the external strobe signal;
    a delay to generate a first delayed signal and a second delayed signal by delaying the first source signal and the second source signal by a preset time; and
    a combination unit to generate the internal strobe signals by selectively combining the first source signal, the second source signal, the first delayed signal, and the second delayed signal.

10. The semiconductor apparatus according to claim 9, wherein the combination unit generates an even strobe signal as one of the internal strobe signals by combining the first source signal and the second delayed signal, and generates an odd strobe signal as an other of the internal strobe signals by combining the second source signal and the first delayed signal.

11. The semiconductor apparatus according to claim 5, wherein the control unit generates the control signal for outputting data stored in the memory block to the outside of the semiconductor apparatus in a DDR manner during a read operation.

12. A strobe signal generation circuit comprising:
    a counter to generate a first source signal by counting a rise edge of a strobe signal and a second source signal by inverting the first source signal;
    to a delay to delay the first source signal and the second source signal by a preset time; and
    a combination unit to generate an even strobe signal and an odd strobe signal according to the first source signal, the second source signal, a first delayed signal, and a second delayed signal.

13. The strobe signal generation circuit according to claim 12, wherein the combination unit combines the first source signal and the second source signal with the first delayed signal and the second delayed signal to generate the even strobe signal and the odd strobe signal.

14. The strobe signal generation circuit according to claim 12, wherein the first source signal and the second source signal are generated according to an other strobe signal of differential strobe signals.

15. The strobe signal generation circuit according to claim 12, wherein the counter generates the first source signal and the second source signal by counting one differential strobe signal.

16. The strobe signal generation circuit according to claim 14, wherein the differential strobe signals include an external strobe signal.

17. The strobe signal generation circuit according to claim 12, wherein the even strobe signal and the odd strobe signal are internal strobe signals.

18. The strobe signal generation circuit according to claim 12, wherein differential strobe signals are provided to indicate an input timing of data during a write operation.

19. The strobe signal generation circuit according to claim 12, wherein the first delayed signal and the second delayed signal are generated by delaying the first source signal and the second source signal through the delay.

20. The strobe signal generation circuit according to claim 19, wherein a generation timing of a rising edge and a falling edge of the first delayed signal is different from a generation timing of a rising edge and a falling edge of the second delayed signal.

\* \* \* \* \*